United States Patent [19]

Carr et al.

[11] Patent Number: 4,609,843
[45] Date of Patent: Sep. 2, 1986

[54] TEMPERATURE COMPENSATED BERLINITE FOR SURFACE ACOUSTIC WAVE DEVICES

[75] Inventors: Paul H. Carr; Jose H. Silva, both of Bedford, Mass.

[73] Assignee: The United States of America as represented by the Secretary of the Air Force, Washington, D.C.

[21] Appl. No.: 705,060

[22] Filed: Feb. 26, 1985

Related U.S. Application Data

[63] Continuation of Ser. No. 461,425, Jan. 27, 1983, abandoned.

[51] Int. Cl.$^4$ ............................................ H01L 41/08
[52] U.S. Cl. ............................. 310/313 A; 310/313 B
[58] Field of Search ........... 310/313 R, 313 A, 313 B, 310/313 C, 313 D; 333/154, 155, 193

[56] References Cited

U.S. PATENT DOCUMENTS 4,012,650  3/1977  Pratt et al. ........................ 333/151 X

OTHER PUBLICATIONS

High Piezoelectric Coupling Temperature-Compensated Cuts of Berlinite (AlPO$_4$) for SAW Applications, by R. M. O'Connell et al., IEEE Transactions on Sonics & Ultrasonics, vol. SU-24, No. 6, Nov. 1977.

Experimental Data on Piezoelectric Properties of Berlinite, Chai et al., 1979 Ultrasonics Symposium, pp. 577–583.

Experimental Determination of the SAW Properties of X-Axis Boule Cuts in Berlinite, Harmon et al., 1978 IEEE, pp. 594–597.

*Primary Examiner*—Mark O. Budd
*Attorney, Agent, or Firm*—Donald J. Singer; Bernard E. Franz

[57] ABSTRACT

The 19.1 propagation X-cut of berlinite (AlPO$_4$) has been discovered to have cubic temperature compensation for surface acoustic waves (SAW). The temperature variations of frequency or time delay over a 35° to 85° C. temperature range are comparable to ST-quartz. However, berlinite has at least twice the piezoelectric coupling. This is essential for low insertion loss, broadband SAW devices such as filters and correlators. In addition, 19.1 propagation, X-cut berlinite has lower volume wave spurious than ST-cut quartz.

6 Claims, 4 Drawing Figures

TEMPERATURE COMPENSATED BERLINITE FOR SURFACE ACOUSTIC WAVE DEVICES

RIGHTS OF THE GOVERNMENT

The invention described herein may be manufactured and used by or for the Government of the United States for all governmental purposes without the payment of any royalty.

This is a continuation of application Ser. No. 461,425 filed Jan. 27, 1983, now abandoned.

BACKGROUND OF THE INVENTION

This invention relates to surface acoustic wave (SAW) substrate members of berlinite, AlPO$_4$, having improved temperature compensation.

U.S. Pat. Nos. 4,109,172 and 4,109,173 to O'Connell provide background information relating to surface acoustic wave devices, and cover specific cuts of berlinite. Dryburgh et al in U.S. Pat. No. 4,189,516 disclose an aluminum nitride SAW material, and Ito et al in U.S. Pat. No. 4,333,842 disclose various X-cut materials. Fisher in U.S. Pat. No. 4,313,070 shows a metal wedge for conducting Raleigh surface waves.

The temperature compensation characteristic of previously known cuts of berlinite have been parabolic.

SUMMARY OF THE INVENTION

An object of the invention is to provide an improved temperature compensation characteristic of SAW substrate members.

The 19.1 propagation X-cut of berlinite (AlPO$_4$) has been discovered to have cubic temperature compensation for surface acoustic waves (SAW). The temperature variations of frequency or time delay over a 35° to 85° C. temperature range are comparable to ST-quartz. However, berlinite has at least twice the piezoelectric coupling. This is essential for low insertion loss, broadband SAW devices such as filters and correlators. In addition, 19.1 propagation, X-cut berlinite has lower volume wave spurious than ST-cut quartz.

The invention significantly reduces the requirement for large power consuming ovens for frequency standards or clocks and for surface acoustic wave (SAW) signal processing components such as filters, matched filters, encoders, and decoders used in communication, radar, navigation, and identification systems.

DETAILED DESCRIPTION

The invention is disclosed in our paper "Second-Order Temperature Coefficients of Singly and Doubly Rotated Cuts of Berlinite" in the 1981 Ultrasonics Symposium Proceedings, published March 1982 by the Institute of Electrical and Electronic Engineers (IEEE).

Introduction

Berlinite is of interest because it is temperature-compensated with greater piezoelectric coupling than quartz. Experimental confirmation of early theoretical predictions (R. M. O'Connell and P. H. Carr, "High Piezoelectric Coupling Temperature Compensated Cuts of Berlinite for SAW Applications", IEEE Trans. Sonics and Ultrasonics, Vol SU-24, p 376, 1977) for SAW were made with X-Axis-boule-80.4 (R. M. O'Connell and P. H. Carr, "New Materials for Surface Acoustic Wave Devices", Proc. of 1978 Ultrasonics Symposium p 590, 1978, and U.S. Pat. No. 4,109,172. Also see U.S. Pat. No. 4,109,173) and X-axis-boule-80-87 orientations (D. Harmon, D. Morency, W. Soluch, J. F. Vetelino and S. D. Mittleman, "Experimental Determination of the SAW Properties of X-Axis Boule Cuts in Berlinite", Proc of 1978 Ultrasonics Symposium, p 594, 1978). Unfortunately, the second order temperature coefficient was about 8 to 9 times larger than ST-cut quartz. Although additional temperature compensated cuts of berlinite were predicted, experimental measurements could not be made due to limitations in the crystal growth technology. Significant advances in this technology (B. H. T. Chai, M. L. Sthan, E. Buehler and M. A. Gilleo, "Experimental Data on Piezoelectric Properties of Berlinite", Proc. of 1979 Ultrasonics Symposium, p 577, 1979) have led to the discovery that the temperature coefficient of the X-cut, 19.1-propagation orientation is cubic. This is the first observation of a cubic temperature dependence for berlinite, which to date, have been parabolic.

Figure 2:
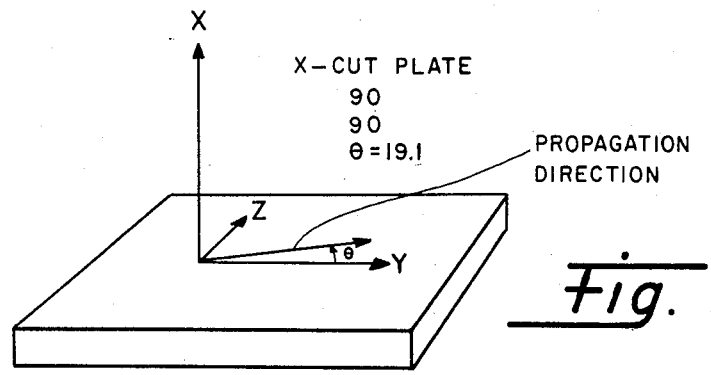
FIG. 2 illustrates a SAW substrate member of berlinite as comprehended by the invention.

The substrate member comprehended by the present invention utilizes a particular one of the berlinite cuts identified as a singly rotated boule cut. FIG. 2 illustrates the substrate member of the invention indicating the crystallographic cut in Euler angles. The particular cut of the Invention is defined by the Euler angles Lambda=90.0°, Mu=90°, and Theta=19.1°. Euler angles and the procedure for crystallographic orientation are described in the O'Connell U.S. Pat. Nos. 4,109,172 and 4,109,173, which are hereby incorporated by reference.

TABLE I

| DOUBLE ELECTRODE TRANSDUCERS | | |
|---|---|---|
| TRANSDUCER | S | L |
| Linewidth and Spacing (μM) | 1.262 | 1.73 |
| Acoustic Aperture (MM) | 0.250 | 0.500 |
| No. of Double Electrodes | 66 | 226 |
| Transducer Length (MM) | 0.333 | 1.06 |
| Transducer Metallization Thickness | 60 A° CR 600 A° Al | 60 A° CR 600 A° Al |

Experimental Method

Figure 1:
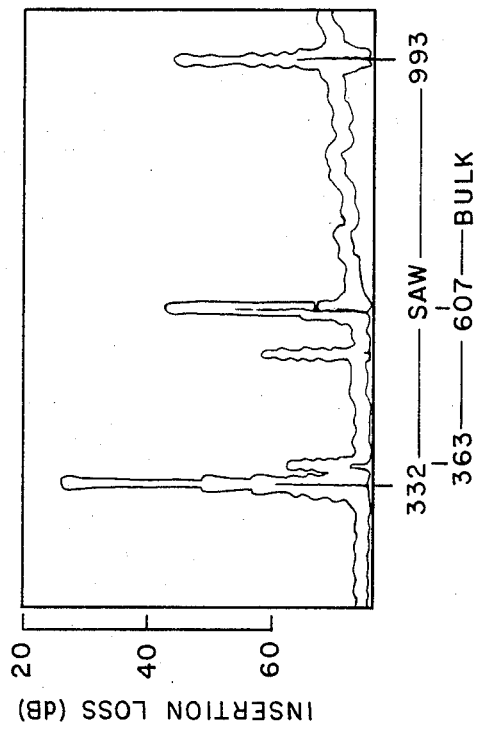
FIG. 1 comprises graphs of insertion loss versus frequency for ST quartz and 19.1 X berlinite.

The frequency dependent insertion loss is shown in FIG. 1 for SAW devices on X-cut, 19.1 propagating berlinite (AlPO$_4$) and for ST-cut quartz (SiO$_2$). Both devices were fabricated with interdigital "L" transducers shown in Table I. The transducers were perpendicular to the direction of propagation shown in FIG. 2. The direction of propagation is 19.1 degrees from the positive Y axis. The plate was perpendicular to the positive X-axis. The transducers were 4.064 mm apart. The berlinite device has its minimum insertion loss at the SAW fundamental of 292 MHz with a third overtone at 872 MHz. The corresponding responses of the quartz device are at slightly higher frequencies corresponding to the higher velocity. The 19.1 cut of berlinite has a lower bulk wave spurious response. This is evidenced by the fact that the ST-quartz has two volume wave signals in the vicinity of 600 MHz which are totally absent in berlinite. The berlinite bulk wave response at 354 MHz is 62 MHz above the desired SAW fundamental while the corresponding response for quartz is only 31 MHz higher. The larger separation makes it easier to use resonant matching techniques to reduce the SAW insertion loss without enhancing the undesired bulk response (A. J. Slobodnik, Jr., G. A. Roberts, J. H. Silva, W. J. Kearns, J. C. Sethares and T. L. Szabo, "Switchable SAW Filter Banks at UHF", IEEE Trans. Sonics and Ultrasonics, Vol. SU-26, p 120 1979). It should be possible to reduce the SAW insertion loss to about 15 dB by resonant matching techniques. Unmatched devices were used in this work to eliminate the temperature dependence of the matching network. The volume wave spurious on ST-quartz at 363 MHz is lower than the corresponding response on berlinite due to the fact that the bottom rough ground surface of quartz was tapered while that of berlinite was not. By tapering the bottom surface of berlinite, a corresponding low response should be obtained.

The temperature dependence of the SAW device was measured by means of the oscillator method (D. Hauden and G. Theobald, "Dynamic Thermal Sensitivity of SAW Quartz Oscillators", Proc. of 1980 Ultrasonics Symposium, p 264, 1980). The SAW device was made to oscillate by introducing amplifiers whose gain was greater than the insertion tion loss between the input and output transducers. The temperature of the SAW devices was controlled by placing it in the center of a cylindrical oven 3.5 inches in diameter by 5.5 inches long. The oven was machined from aluminum and heating wires were placed on the outside surface of the cylinder. The temperature of the SAW device was measured by a Hewlett-Packard Model 2804 quartz crystal thermometer in contact with the center of the device. The temperature of the oven could be held to 0.1° C. by a Hewlett-Packard Model 85 controller, which determined the output of a HP6002A DC power supply. Temperatures below ambient were obtained by placing the oven in a freezer. The HP 85 controller was also programmed to measure the frequency and temperature at prescribed temperature intervals. The oscillator frequency was measured after it had stabilized at a given temperature.

Discussions of Results

Figure 3:
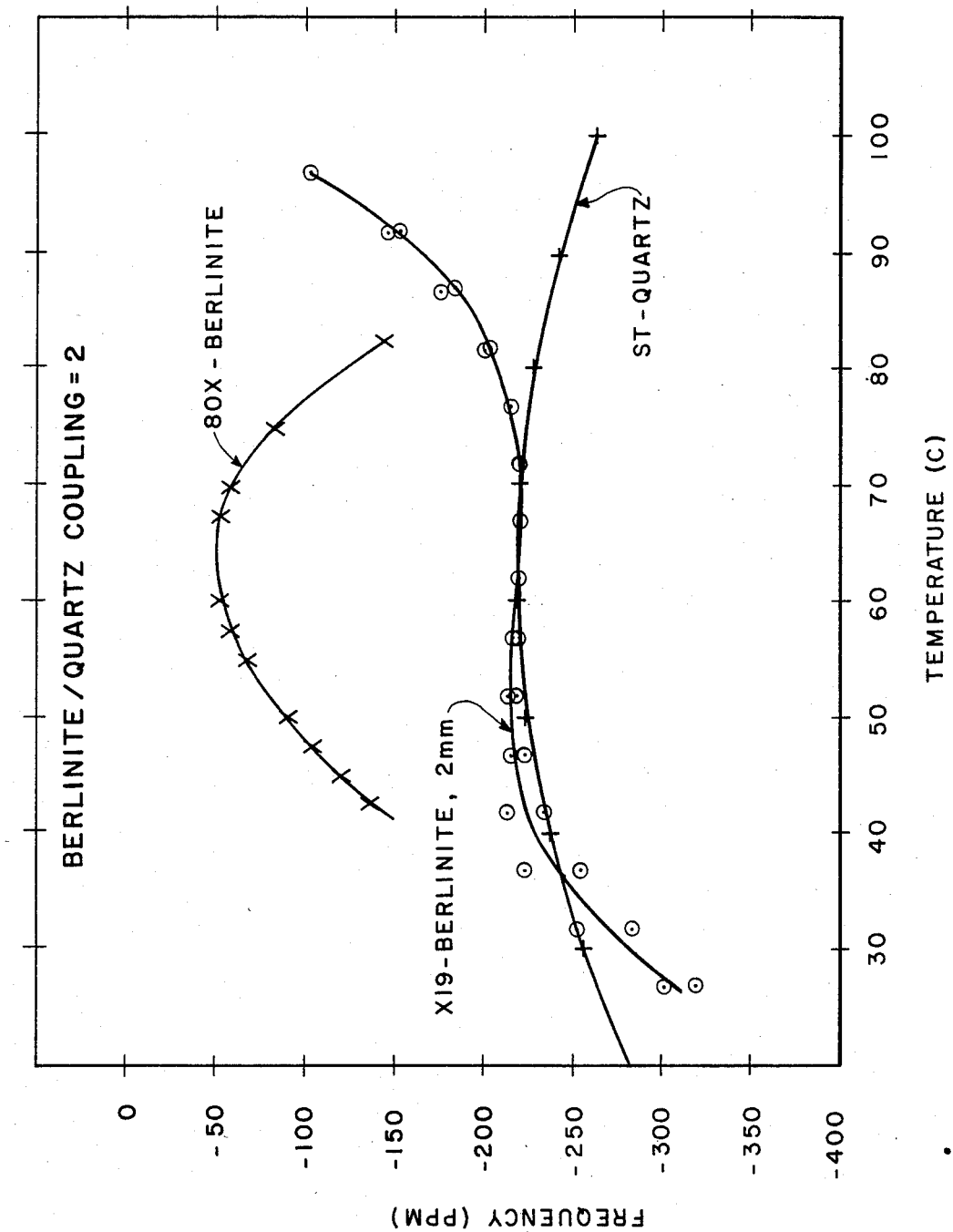
FIG. 3 is a graph showing the fractional frequency change of a SAW oscillator on 19.1 X-cut berlinite as a function of temperature.

FIG. 3 shows a plot of the fractional frequency change of a SAW oscillator on X-cut, 19.1 propagating berlinite as a function of temperature. The SAW delay line path consisted of two "S" transducers spaced 2 mm apart. The cubic temperature dependence has an inflection point at 60.6° C., at which temperature the linear temperature coefficient is only −0.6 parts per million. The frequency variation of X19.1 berlinite is comparable to ST-quartz over a 35° to 85° C temperature range. However, berlinite has twice the piezoelectric coupling of quartz, which is needed for wide-band applications. The temperature coefficient of the X-axis-boule-80.4 cut is also shown for comparison. Its temperature coefficient is 9 times that of ST-quartz.

Figure 4:
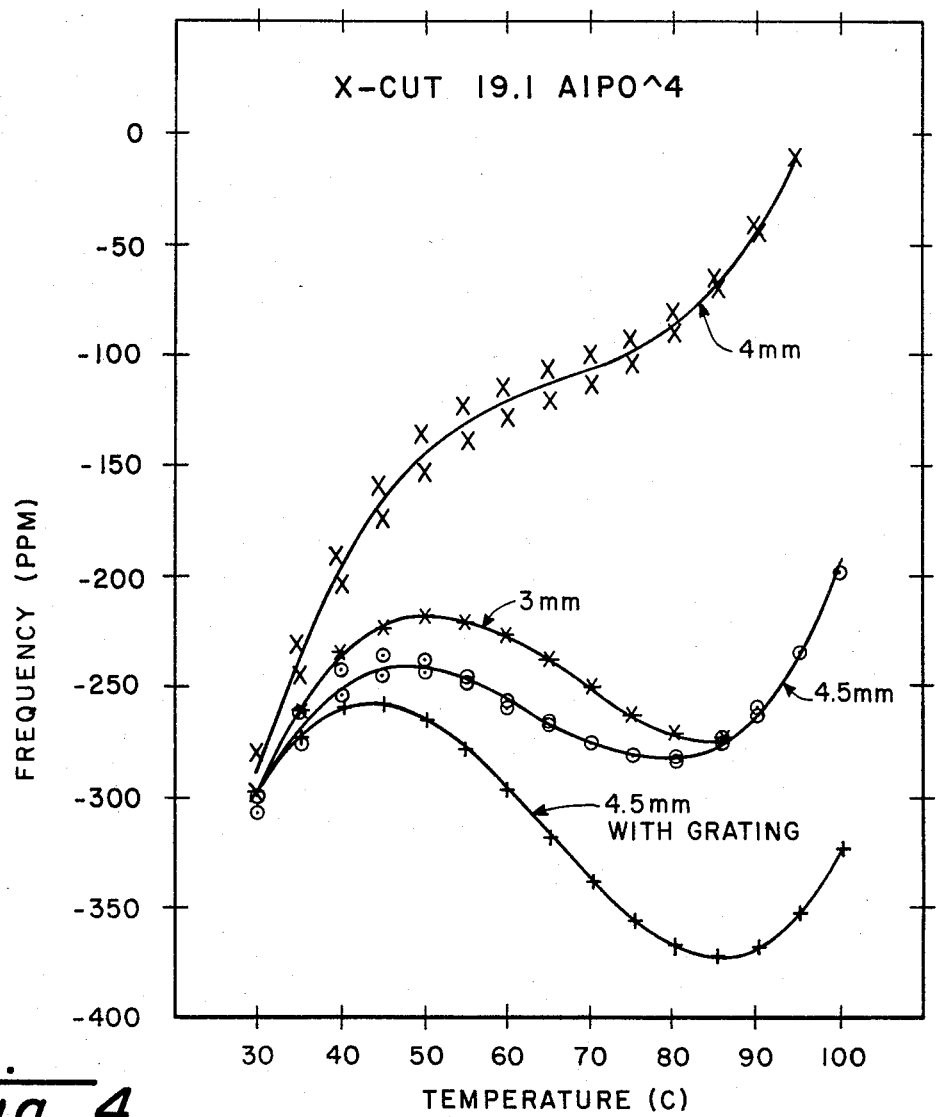
FIG. 4 is a graph showing the dependence of the temperature coefficient on the spacing between transducers.

The dependence of the temperature coefficient on the spacing between transducers is shown in FIG. 4. The four curves were made with "L" transducers whose center-to-center spacings were 4.064 mm, 3.048 mm, 4.50 mm, and 4.50 mm with a grating. The grating consisted of 352 lines and spaces (each 1.106 μm wide) connected to a bus-bar on both sides. The slope of the linear section of the curve near the 60° C. inflection point varies from +1.4 ppm/°C. for 4.064 mm spacing to −2.9 ppm/°C. for 4.50 mm spacing. This implies that there is a spacing with zero temperature coefficient which should be of great importance for ovenized oscillators. For the 4.50 mm spacing, the frequency changes by less than 65 ppm over a 30 to 95° C. range. This variation is comparable to ST-quartz.

Work is continuing to understand the dependence of the cubic temperature coefficient on transducer spacing. The direction of propagation can be reproduced to an accuracy of 0.5 degrees. Temperature dependent beam-steering may be responsible for the effect (D. F. Williams and F. Y. Cho, "Temperature Variations of SAW Power Flow Angle", Electronics Letters, Vol. 17, p 164, 1981).

Thus, while preferred constructional features of the invention are embodied in the structure illustrated herein, it is to be understood that changes and variations may be made by the skilled in the art without departing from the spirit and scope of my invention.

We claim:

1. A surface acoustic wave device substrate member of single crystal berlinite having an acoustic surface wave propagation surface defined by a plane that substantially coincides with the Euler angles Lambda=90.0°, Mu=90.0°, and Theta=19.1°, with transducer means for surface wave coupling which provides cubic temperature compensation, with transducer means perpendicular to the direction of propagation which is 19.1° from the positive X-axis for surface wave coupling, wherein said transducer means comprises interdigital transducers about 2 millimeters apart having a transducer length of about 0.333 millimeters, a linewidth and spacing of about 1.262 micrometers, and an acoustic aperture of about 0.250 millimeters, whereby the device provides cubic temperature compensation and a significantly lower bulk wave spurious response compared to ST-cut quartz, the frequency separation between the surface acoustic wave fundamental and the closest bulk wave response being substantially greater than in ST-cut quartz.

2. A surface acoustic wave device substrate member according to claim 1 wherein said transducer means comprises 66 double electrode transducers of 60 Å CR and 66 Å Al metallization.

3. A surface acoustic wave device substrate member of single crystal berlinite having an acoustic surface wave propagation surface defined by a plane that substantially coincides with the Euler angles Lambda=90.0°, Mu=90.0°, and Theta=19.1°, with transducer means for surface wave coupling which provides cubic temperature compensation, with transducer means perpendicular to the direction of propagation which is 19.1° from the positive X-axis for surface wave coupling, wherein said transducer means comprises interdigital transducers between 3 and 4.5 millimeters apart having a transducer length of about 1.06 millimeters, a linewidth and spacing of about 1.73 micrometers, and an acoustic aperture of about 0.500 millimeters, whereby the device provides cubic temperature compensation and a significantly lower bulk wave spurious response compared to ST-cut quartz, the frequency separation between the surface acoustic wave fundamental and the closest bulk wave response being substantially greater than in ST-cut quartz.

4. A surface acoustic wave device substrate member according to claim 3, wherein said transducer means comprises 226 double electrode transducers of 60 Å CR and 66 Å Al metallization.

5. A method of using a surface acoustic wave device substrate member of single crystal berlinite having an acoustic surface wave propagation surface defined by a plane that substantially coincides with the Euler angles Lambda=90.0°, Mu=90.0°, and Theta=19.1°, using the device in an oven at a temperature of about 60° C., and using transducer means for surface wave coupling,
said transducer means comprising interdigital transducers about 2 millimeters apart having a transducer length of about 0.333 millimeters, a linewidth and spacing of about 1.262 micrometers, and an acoustic aperture of about 0.250 millimeters,
whereby the device provides cubic temperature compensation and a significantly lower bulk wave spurious response compared to ST-cut quartz, the frequency separation between the surface acoustic wave fundamental and the closest bulk wave response being substantially greater than in ST-cut quartz.

6. A method of using a surface acoustic wave device substrate member of single crystal berlinite having an acoustic surface wave propagation surface defined by a plane that substantially coincides with the Euler angles Lambda=90.0°, Mu=90.0°, and Theta=19.1°, using the device in an oven at a temperature of about 60° C., and using transducer means for surface wave coupling,
said transducer means comprising interdigital transducers between 3 and 4.5 millimeters apart having a transducer length of about 1.06 millimeters, a linewidth and spacing of about 1.73 micrometers, and an acoustic aperture of about 0.500 millimeters,
whereby the device provides cubic temperature compensation and a significantly lower bulk wave spurious response compared to ST-cut quartz, the frequency separation between the surface acoustic wave fundamental and the closest bulk wave response being substantially greater than in ST-cut quartz.

* * * * *